(12) United States Patent
Schmidt et al.

(10) Patent No.: US 8,829,779 B2
(45) Date of Patent: Sep. 9, 2014

(54) ELECTROLUMINESCENT DEVICE

(75) Inventors: Peter Schmidt, Aachen (DE);
Hans-Helmut Bechtel, Roetgen (DE);
Wolfgang Busselt, Roetgen (DE);
Baby-Seriyati Schreinemacher,
Eynatten (BE)

(73) Assignee: Koninklijke Philips N.V., Eindhoven (NL)

( * ) Notice: Subject to any disclaimer, the term of this patent is extended or adjusted under 35 U.S.C. 154(b) by 822 days.

(21) Appl. No.: 12/293,099

(22) PCT Filed: Mar. 13, 2007

(86) PCT No.: PCT/IB2007/050841
§ 371 (c)(1),
(2), (4) Date: Sep. 16, 2008

(87) PCT Pub. No.: WO2007/107917
PCT Pub. Date: Sep. 27, 2007

(65) Prior Publication Data
US 2009/0066221 A1    Mar. 12, 2009

(30) Foreign Application Priority Data

Mar. 21, 2006    (EP) .................................. 06111437

(51) Int. Cl.
| | | |
|---|---|---|
| H01J 1/62 | (2006.01) |
| H01J 63/04 | (2006.01) |
| C04B 35/626 | (2006.01) |
| C09K 11/77 | (2006.01) |
| C04B 35/44 | (2006.01) |
| C04B 35/16 | (2006.01) |
| C04B 38/00 | (2006.01) |
| C04B 35/645 | (2006.01) |
| C04B 111/80 | (2006.01) |
| H01L 33/50 | (2010.01) |

(52) U.S. Cl.
CPC ....... C09K 11/7774 (2013.01); C04B 2111/807 (2013.01); C04B 2235/3213 (2013.01); C04B 2235/3229 (2013.01); C04B 2235/3217 (2013.01); C04B 2235/3224 (2013.01); C04B 2235/764 (2013.01); C04B 35/6261 (2013.01); C04B 35/44 (2013.01); C04B 35/16 (2013.01); C04B 2235/3215 (2013.01); C04B 2235/3208 (2013.01); C04B 38/0074 (2013.01); C04B 2235/77 (2013.01); C04B 2235/658 (2013.01); C04B 2235/3225 (2013.01); C04B 38/0054 (2013.01); C04B 2235/608 (2013.01); C04B 35/6265 (2013.01); C04B 35/645 (2013.01); C04B 2235/652 (2013.01); H01L 33/502 (2013.01); C04B 2235/5445 (2013.01); C04B 2235/663 (2013.01)
USPC .......................................................... 313/503

(58) Field of Classification Search
USPC ................................................. 313/498–512
See application file for complete search history.

(56) References Cited

U.S. PATENT DOCUMENTS

| | | | |
|---|---|---|---|
| 4,242,221 A | 12/1980 | Cusano et al. | |
| 6,791,259 B1 * | 9/2004 | Stokes et al. ................ | 313/503 |

(Continued)

FOREIGN PATENT DOCUMENTS

| | | |
|---|---|---|
| DE | 10349038 A1 | 5/2004 |
| DE | 10335167 A1 | 3/2005 |

(Continued)

*Primary Examiner* — Anh Mai
*Assistant Examiner* — Zachary J Snyder

(57) ABSTRACT

A conversion element (3) comprising a ceramic material (31) with a multiplicity of pores (32) provided for at least the partial absorption of at least one primary radiation (52) and for transforming the primary radiation (52) into at least one secondary radiation (53), wherein the conversion element (3) has a density greater than or equal to 97% of the theoretical solid-state density of the ceramic material (31), and the pores (32) in the conversion element (3) have a diameter substantially between 200 nm and 5000 nm.

17 Claims, 6 Drawing Sheets

(56) References Cited

U.S. PATENT DOCUMENTS

Figure 1A:
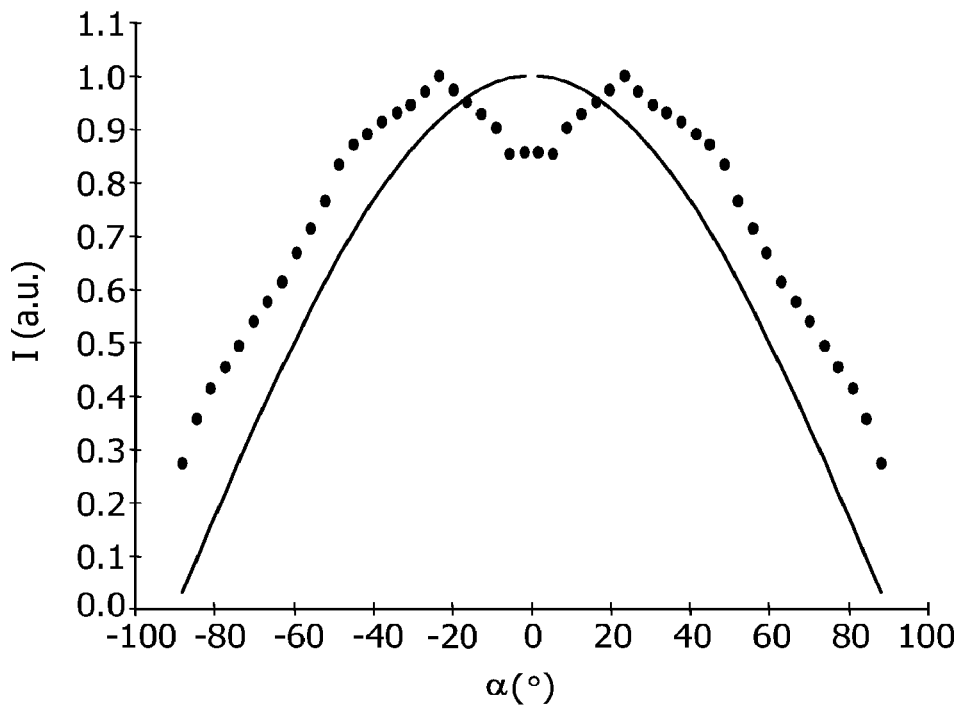

2003/0080341 A1    5/2003  Sakano et al.
2004/0145308 A1*  7/2004  Rossner et al. ............... 313/512
2004/0159849 A1    8/2004  Negley
2005/0269582 A1*  12/2005  Mueller et al. ................ 257/94

FOREIGN PATENT DOCUMENTS

| | | |
|---|---|---|
| EP | 1588991 A1 | 10/2005 |
| EP | 1605028 A1 | 12/2005 |
| WO | 2005119797 A1 | 12/2005 |

* cited by examiner

ELECTROLUMINESCENT DEVICE

The invention relates to an efficient electroluminescent device having a radiation pattern similar to a cosinusoidal radiation pattern, comprising a conversion element for converting light, and to a method of manufacturing the conversion element.

Phosphor-converted electroluminescent devices (pcLEDs) with an electroluminescent light source (LED) and a light-converting phosphor layer, typically a phosphor powder layer or a polycrystalline phosphor layer, are known. With such pcLEDs, the LED emits a primary radiation of which at least one portion is absorbed by a phosphor layer (conversion element) arranged on the LED and is re-emitted as longer-wave secondary radiation. This process is also referred to as color or light conversion. Depending upon the application, the primary radiation is completely converted into secondary radiation or, in the case of a partial conversion, differently colored light, for example white light, may be produced by mixing of the primary and the secondary radiation. In order to obtain the same mixed color in all directions of the beam, it is necessary to make sure that the radiation patterns of primary and secondary radiation differ as little as possible from each other. As a rule, the secondary radiation is produced nondirectionally in the active material. Thus, the radiation pattern is essentially determined by the subsequent optical path.

In the case of a strongly scattering powder layer, the light is radiated with an intensity distribution that has a cosinusoidal dependence on the viewing angle (cosinusoidal or Lambertian radiation pattern). However, the high scattering power of a powder layer has the result that a large portion of the primary radiation and the secondary radiation is lost owing to non-radiating absorption processes. In the case of a transparent conversion element (here "transparency" refers to the transmissivity of the conversion element with respect to the secondary radiation), a significant portion of the non-directionally produced secondary radiation is emitted, owing to total reflection, not by the main light emission surface essentially parallel to the surface of the electroluminescent light source but by the lateral surfaces of the conversion element, which are at a large angle to the main light emission surface. Thus, the luminance of the light issuing from the main light emission surface (parallel to the surface of the electroluminescent light source) of the conversion element is decreased, in some embodiments it is possibly even lower than the luminance of the light issuing from the lateral surfaces. The radiation pattern (depending on the intensity distribution I [a.u.] of the viewing angle α) in FIG. 1$a$ for such a pcLED with a transparent conversion element (dotted line) is determined essentially by the emission of the secondary radiation at the lateral surfaces and deviates strongly from a cosine distribution (continuous line). The reduced luminance of the main light emission surface is undesirable. As a comparison, FIG. 1$b$ shows the radiation pattern (dotted line) of a pcLED with a phosphor powder layer, which corresponds well with a cosine distribution (continuous line). Transparent phosphor layers are characterized by a higher efficiency in contrast to powder layers. The intensities measured and calculated in FIGS. 1$a$ and 1$b$ were each standardized at 1.

DE 10349038 (also published as USPA 2004/0145308, "LIGHT SOURCE HAVING AN LED AND A LUMINESCENCE CONVERSION BODY AND METHOD FOR PRODUCING THE LUMINESCENCE CONVERSION BODY", 29 Jul. 2004 for Wolfgang Rossner and Berit Wessler) discloses a light source having an LED and a conversion element for transforming primary radiation of the LED into a secondary radiation. The conversion element is a polycrystalline ceramic body, which is sintered together from individual crystallites (also called grains). The crystallites consist of a selected base material into which a doping agent is diffused here for transforming primary radiation. For example, Ce-doped yttrium-aluminum garnet (YAG:Ce) may be used as a material. The ceramic material of the conversion element has a density of above 90% relating to the theoretical density of a pure monocrystal. Starting from this ceramic density, the ceramic body is characterized by a sufficiently high translucence (showing through) with respect to the secondary radiation. The grain size of the crystallites (grains) in the ceramic material is preferably 10 μm to 50 μm. In ceramic materials there may be hollow spaces, which are not filled with ceramic material, between the crystallites, which spaces are referred to as pores. The pores between the crystallites function as scattering centers for primary and secondary radiation. The document DE 10349038 correlates the pore quantity and pore size with the density of the conversion element. The lower the density, the larger the number of the pores functioning as scattering centers. With a theoretical density of the ceramic conversion element of between 93% and 98%, a homogeneous color impression is obtained for a plate-like conversion element over a relatively large surface according to document DE 10349038. Advantageous scattering characteristics of such a ceramic material for producing a homogeneous color impression for the viewer may, however, lead to a low luminous efficiency in the case of unfavorable pore sizes.

It is an object of the invention to provide a translucent ceramic conversion element which is suitable for radiating light with a Lambertian radiation pattern and to combine an improved luminous efficiency with an improved luminance when it is used in phosphor-converted electroluminescent devices.

This object is achieved by a conversion element comprising a ceramic material with a multiplicity of pores provided for at least the partial absorption of at least one primary radiation and for transforming primary radiation into at least one secondary radiation, wherein the conversion element has a density greater than or equal to 97% of the theoretical solid-state density of the ceramic material, and the pores in the conversion element essentially have a diameter of between 250 nm and 2900 nm. The conversion element has a high translucence owing to the high density. Here, the theoretical solid-state density of the ceramic material denotes the density of the relevant material in monocrystalline form. The scattering characteristics for producing a Lambertian radiation pattern of the mixed light of primary and secondary radiation are determined by the pores in the ceramic material. The conversion elements with pore diameters between 250 nm and 2900 nm are suitable for achieving a luminous efficiency of 80% and more in electroluminescent devices. Here, the ratio between the number of emitted photons of an electroluminescent device with a conversion element and the number of emitted photons of an electroluminescent device without a conversion element is denoted as "luminous efficiency". Pore diameters smaller than 250 nm or larger than 2900 nm clearly lead to a lower luminous efficiency, for example 65% for pore diameters in the range of 6000 nm or 60% for pore diameters of 100 nm. The term "essentially" is understood hereinafter to mean that the number of pores with diameters beyond the specified range is so small that their influence on the luminous efficiency is smaller than 1 percentage point. The term pore diameter is understood to mean the diameter of a sphere having the same volume as the corresponding pore. The pores in the ceramic material do not necessarily have to have a spherical shape.

In an embodiment, the ceramic material is provided for at least the partial transformation of blue or ultraviolet primary radiation. Any secondary radiation within the visible spectrum, and if necessary the even longer-wave spectrum, can be produced by the transformation of the blue or ultraviolet primary radiation.

In a further embodiment, the pores have a proportional volume of less than or equal to 2% of the conversion element. For the purpose of light scattering, the ratio between the proportional volume of the pores and the proportional volume of the ceramic material to the total volume of the conversion element is crucial, particularly if the individual crystallites (grains) of the ceramic material have a density smaller than 100% of the theoretical solid density, for example owing to the existence of secondary phases in the material. A too large proportional volume of the pores would lead to an increased scattering of the light. The too strong scattering extends the average optical path of the radiation in the conversion element and increases the portion of the radiation that leaves the conversion element against the radiation direction, which leads to higher radiationless absorption losses and thus to a reduced luminous efficiency.

In a further embodiment, the diameter of the pores is essentially between 300 nm and 1700 nm. The conversion elements with pore diameters in this range are essentially suitable for electroluminescent devices with which a luminous efficiency of 85% and more is to be achieved. With these pore diameters, the luminous efficiency is again higher by at least 5 percentage points as compared with the diameter range of 250 nm to 2900 nm.

In a further embodiment, the pores have a pore diameter distribution that may be essentially described with what a so-termed log-normal distribution whose width is less than 100 nm. With the small variation of the pore diameters, the improvement in the luminous efficiency may be increased still further. Here, a distribution is denoted as a log-normal distribution if the relative number n (a) of pores with a pore diameter a around an average pore diameter $a_0$ is as follows:

$$n(a) = \frac{N}{as\sqrt{2\pi}} \exp\left[-\frac{\ln^2(a/a_0)}{2s^2}\right]$$

Here s denotes the width of the distribution n (a) of the different pore diameters a with an average pore diameter $a_0$. N is the total number of the pores.

Furthermore, the invention relates to an electroluminescent device comprising an electroluminescent light source for emitting at least one primary radiation along a radiation direction and at least one conversion element coupled optically to the electroluminescent light source as defined in claim 1 for producing a mixed light of primary radiation and secondary radiation. With the conversion element according to the invention as defined in claim 1, the electroluminescent devices with an improved luminous efficiency may be produced with the simultaneously present Lambertian radiation pattern and a high luminance in the direction of the radiation of mixed light. Compared with electroluminescent devices with phosphor powder layers, the luminous efficiency can be increased by up to 30%, compared with electroluminescent devices with conversion elements of polycrystalline ceramic bodies with unfavorable pore sizes, the increase may be up to 20% or more, depending upon the pore diameter. Both organic LEDs (OLEDs) and inorganic LEDs (LEDs) may be used as electroluminescent light sources. The light sources may be individual LEDs or OLEDs, arrays of LEDs or OLEDs, or large-surface OLEDs. Several conversion elements of the same or different materials may also be used for producing the same or differently colored secondary radiation and/or for absorbing the same and different-colored primary radiation, in particular for planar light sources (arrays of LEDs or OLEDs and/or large-surface OLEDs). The term "colored" refers to the wavelength of the radiation and includes the wavelengths in the non-visible spectral region. Optical coupling is understood to mean the avoidance of an optical transition into a medium with a refractive index lower than 1.1 in the optical path between the electroluminescent light source and the conversion element. For this purpose, the conversion element may be directly arranged on the electroluminescent light source, or one or more transparent layers with suitable refractive indices may be arranged between the conversion element and the electroluminescent light source.

In an embodiment, the conversion element is optically coupled to the electroluminescent light source by means of a transparent layer with a refractive index higher than 1.3. Such layers are, for example, silicone layers with a refractive index of 1.5.

In an embodiment of the electroluminescent device, the conversion element has a thickness between 30 μm and 3000 μm in the radiation direction of the primary radiation. A thickness of above 30 μm guarantees a Lambertian radiation pattern for arbitrary wavelengths and enables a transmissivity to the primary radiation, which renders it possible to achieve any desired color points of the mixed light. Greater thicknesses are used for electroluminescent devices in which a complete transformation of the primary radiation into secondary radiation is desired.

In a further embodiment, the electroluminescent device furthermore comprises a lens which encloses the electroluminescent light source and the conversion element. The radiation properties of the electroluminescent device may be influenced by the lens, for example for focusing, defocusing, or deflecting the mixed light.

Furthermore, the invention relates to a method of manufacturing a conversion element as defined in claim 1, comprising the following steps:
  mixing source materials with a suitable average grain size in a suitable quantitative proportion and a suitable quantity of a fluxing agent,
  manufacturing a microscopically homogeneous mass, which comprises the mixed source materials for further processing into a green body,
  forming a green body with a green body density of at least 50% of the theoretical density of the ceramic material, and
  manufacturing the conversion element (3) through sintering of the green body at temperatures between 1500° C. and 1900° C., adapted to the characteristics of the green body, in a reducing or inert atmosphere in a suitable pressure range and over a time duration adapted to the volume of the green body.

An essential parameter for the pore size is the average grain size of the crystallites in the specific source materials. These determine not only the general sintering and reaction behavior, but also the minimum pore size that can be obtained in a ceramic material according to the invention. The grain size distribution of the source materials may be adjusted, for example, by grinding. Larger average grain sizes of the source materials correspond to larger pore diameters, given the same manufacturing conditions. Here, the average grain size of the source materials should be smaller than the desired average pore diameter as a rule. The words "a suitable quantity of the fluxing agent quantity" are understood to mean a quantity with which no undesirable secondary phases remain in the ceramic material, which may lead not only to additional scattering but also to luminescence degradation. For example, a 500 to 2000 ppm by weight of $SiO_2$ is a typical suitable quantity for a fluxing agent in YAG. A too small quantity of a fluxing agent does not have a negative effect on the occurrence of secondary phases. With the mixed source materials, a microscopically homogeneous mass, that is a mass having a homogeneous composition in the micrometer range, is manufactured for subsequent treatment into a green body (preliminary stage of the ceramic material before sintering). For producing the specified density of the subsequent ceramic material, the green body should be compressed within the specified pressure range. For example, isostatic pressing with pressures between 2000 bar and 7000 bar may be used for the uniform compression of the green body in order to achieve the desired sintering behavior and a uniform pore distribution. With the same sintering conditions, a higher density of the green body also means a higher density of the subsequent ceramic material. Accordingly, the same densities in the ceramic material may be obtained with a higher density of the green body at a shorter sintering time or a lower sintering temperature. Furthermore, pore size and pore concentration may be affected as follows:

a) sintering temperature: a higher sintering temperature results in higher densities of the ceramic material and smaller pores, lower sintering temperatures have the reverse effect, b) sintering time: a longer sintering time results in higher densities and smaller pores, a shorter time has the corresponding reverse effect, c) fluxing agent: adding a fluxing agent such as, for example, $SiO_2$ to the source materials under the same sintering conditions results in higher densities and larger pores, because the grain growth is enhanced, d) pressure range of the atmosphere during the sintering process: the pressure of the gas in the pore volume represents a counter force to the shrinking process of the material while sintering. High pressures lead to a lesser shrinking process and thus tends towards larger pores, low pressures cause the opposite. Typical pressures are in the range between $10^{-9}$ and $10^2$ bar.

In an embodiment, the conversion element is heated after the sintering process at temperatures between 1250° C. and 1400° C. in an oxygenous atmosphere for removing the oxygen defects for a time duration adapted to the volume of the conversion element. In a ceramic material treated in this way, more than 90% of the absorbed quanta of the primary radiation are converted into secondary radiation (high quantum yield) in the conversion element.

In a further embodiment, the source materials for the conversion element (31) are powdered $Y_2O_3$, $Al_2O_3$, $Gd_2O_3$, and $CeO_2$, and there is a quantitative proportion of (Y+Gd+Ce)/Al of between 0.597 atom % and 0.601 atom % in the conversion element. With the quantitative proportions (in atom %) in the indicated range, only a small portion of secondary phases is obtained in the ceramic material, and thus a material with a high quantum yield. Calcining losses, for example of water and/or $CO_2$, are to be taken into consideration in the manufacture of the conversion element with the originally weighed-in quantities in the composition of the source materials.

These and other aspects of the invention are apparent from and will be elucidated with reference to the embodiments described hereinafter, though the invention should not be considered as limited to these.

Figure 1B:
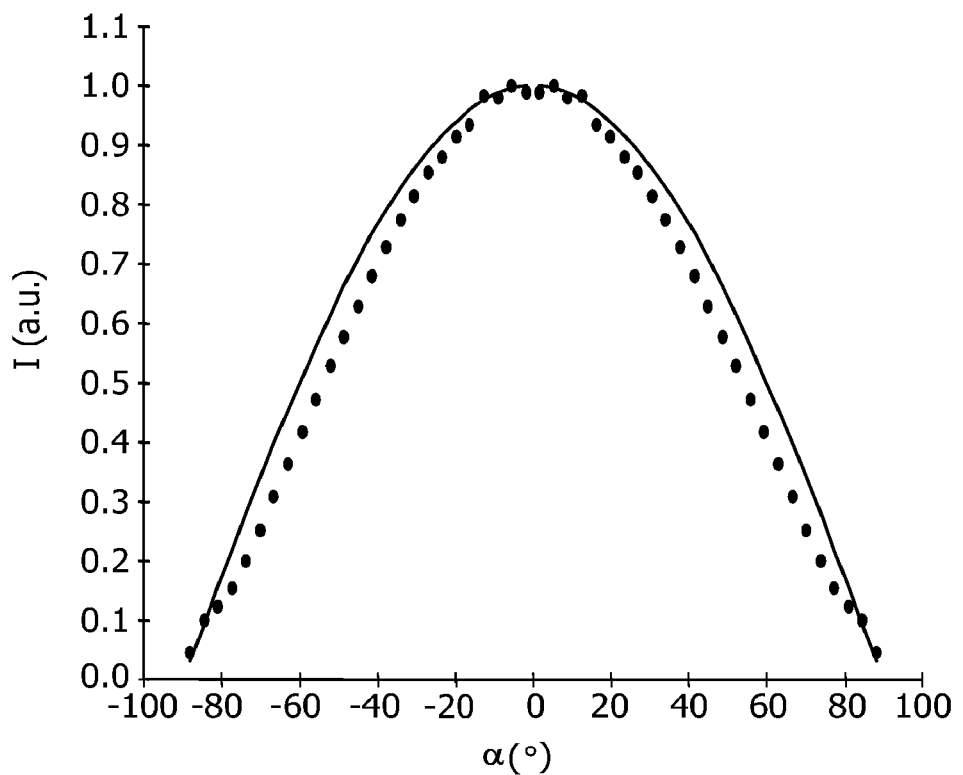
Figure 2:
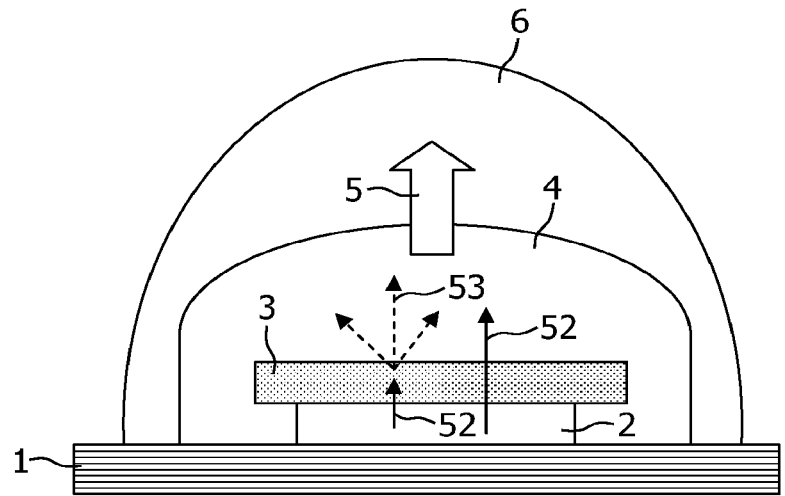
Figure 3:
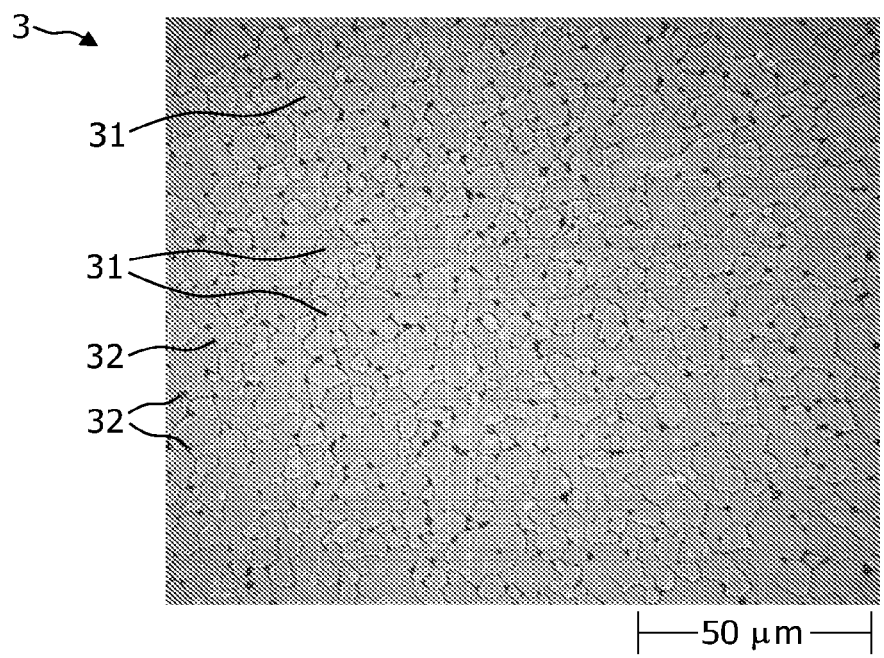
Figure 4:
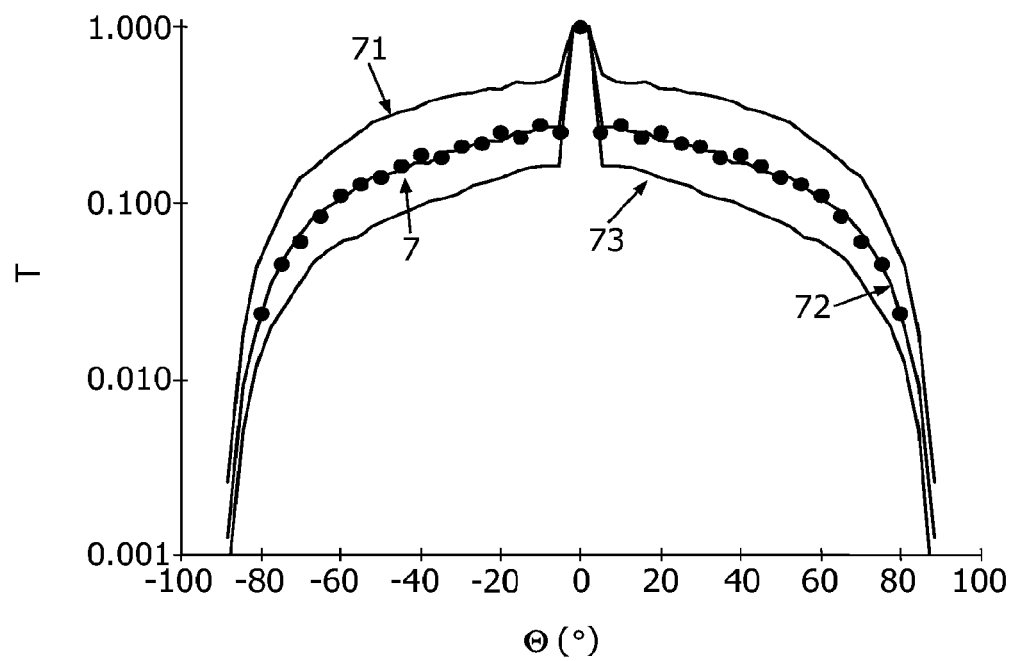
Figure 5:
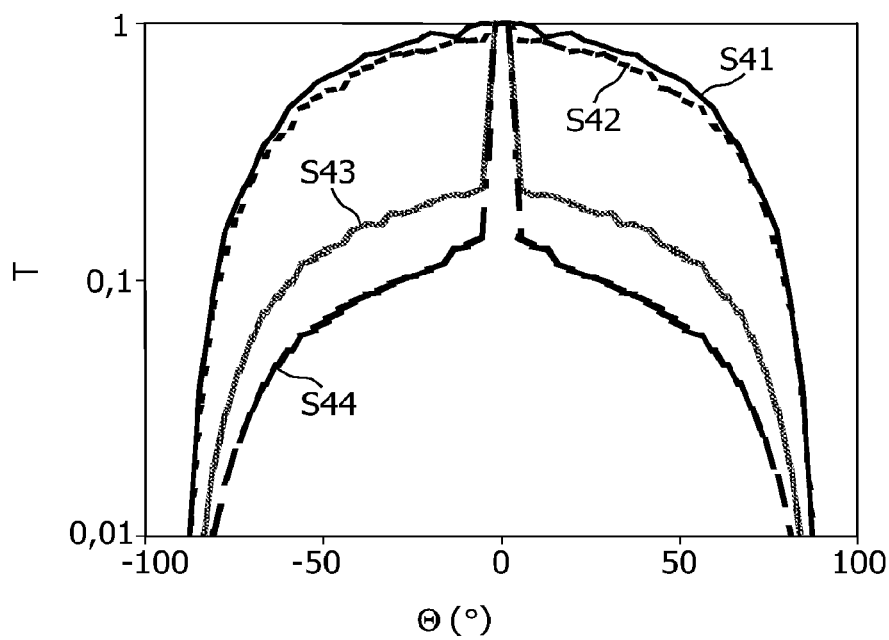
Figure 6:
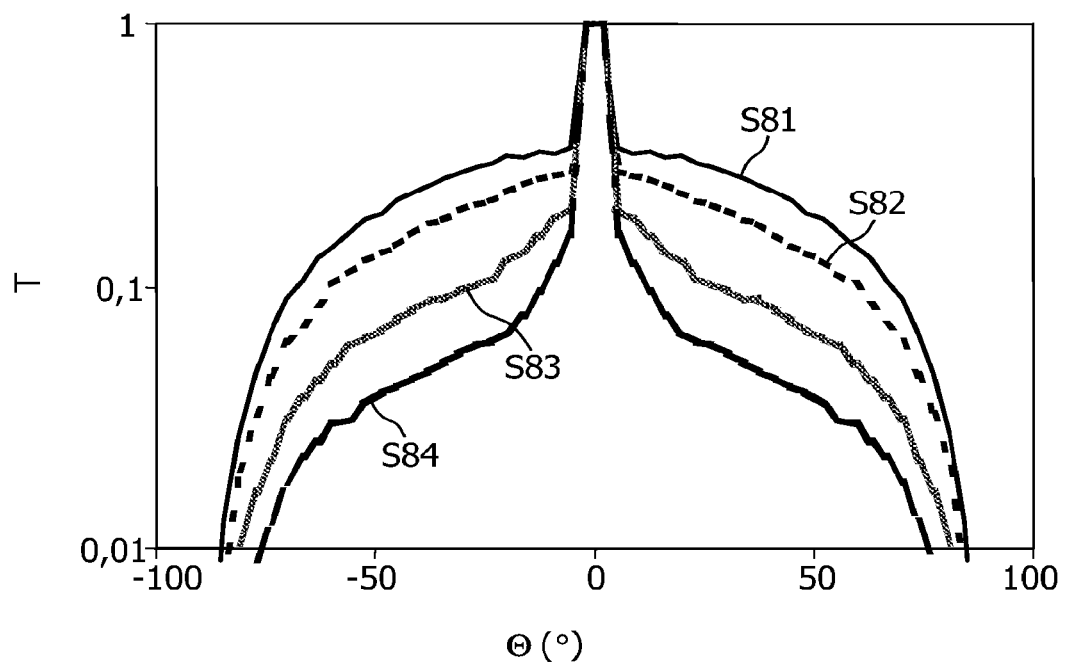
Figure 7:
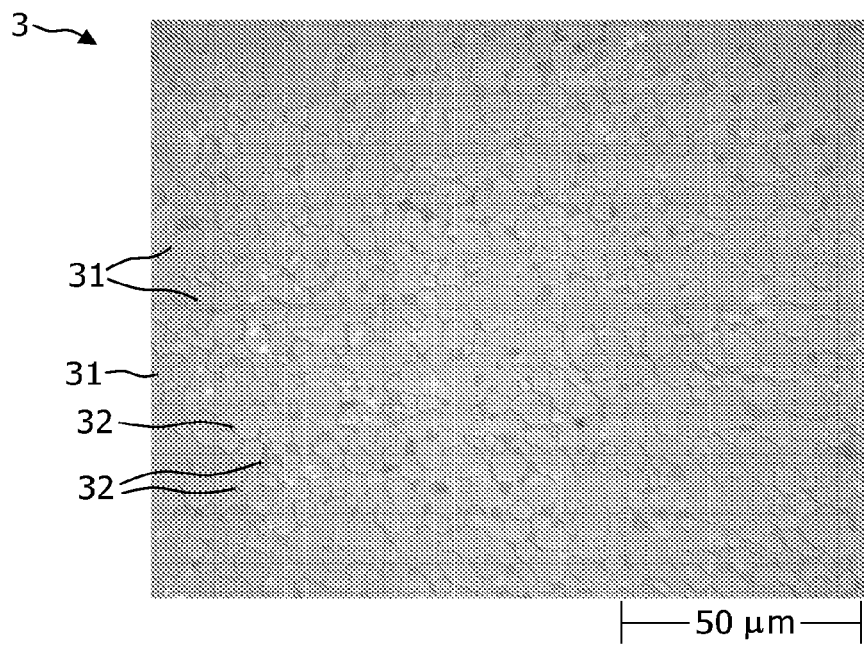
Figure 8:
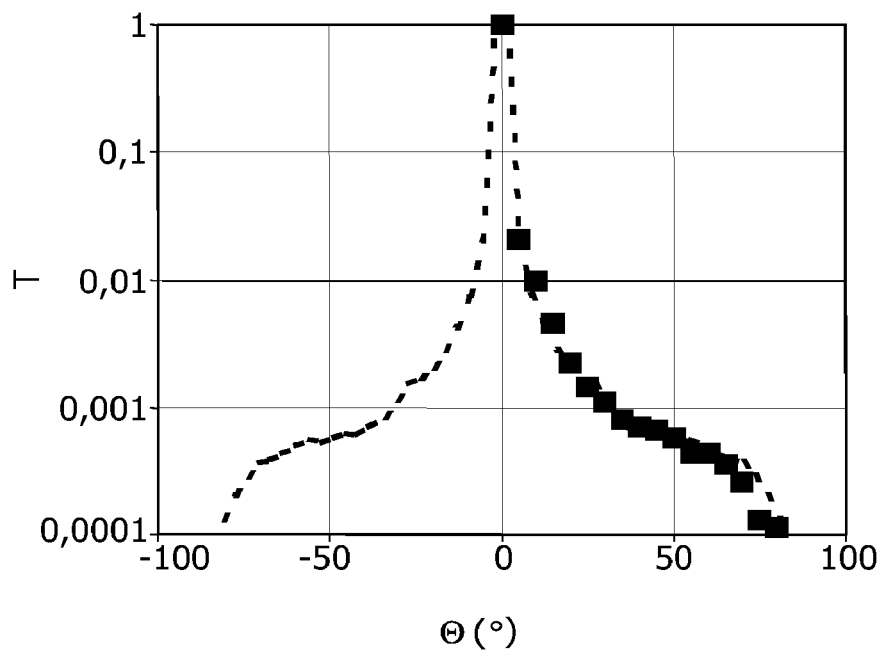
Figure 9:
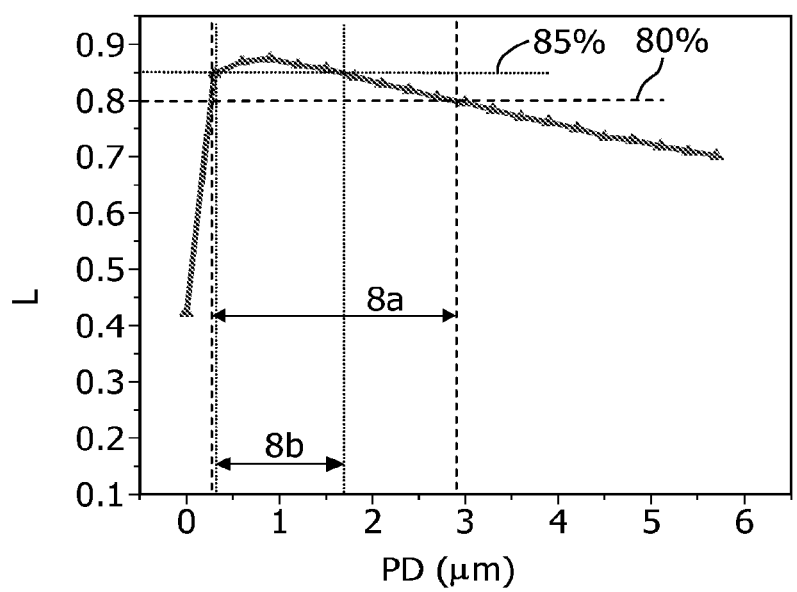
Figure 10:
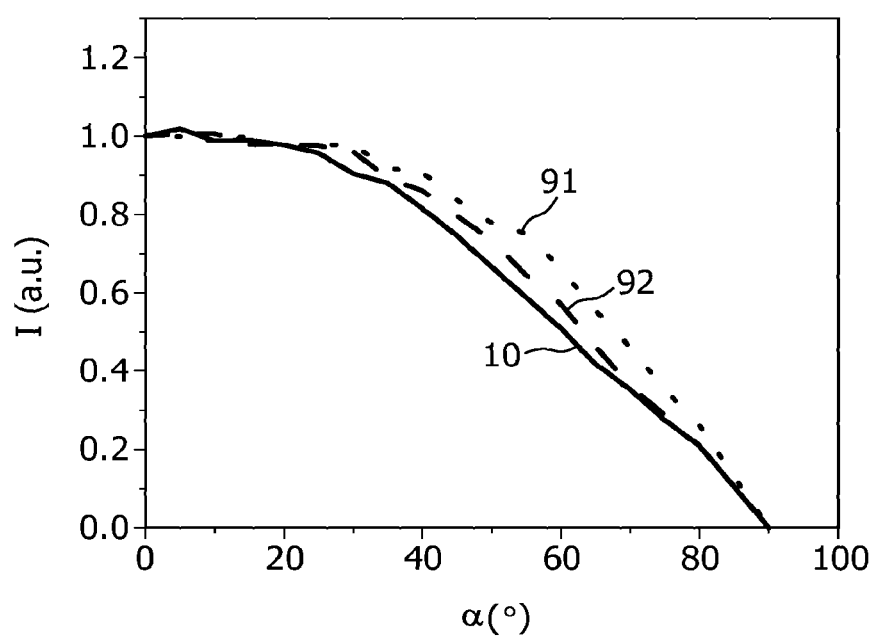

In the drawings:

FIG. 1a shows the radiation pattern of a pcLED with a transparent conversion element, wherein the intensity of the secondary radiation I (a.u.) is shown as a function of the viewing angle α, FIG. 1b shows the radiation pattern of a pcLED with a phosphor powder layer as a conversion element, wherein the intensity of the secondary radiation I(a.u.) is shown as a function of the viewing angle α, FIG. 2 is a schematic side view of an electroluminescent device according to the invention, with a conversion element according to the invention, FIG. 3 shows a microscopic photo of a cutting plane of a conversion element according to the invention, FIG. 4 shows the transmission T of perpendicularly incident light (wavelength 660 nm) as a function of the transmission angle Θ for the conversion element according to the invention from FIG. 3 in comparison with the calculated light distribution for determining the pore diameter, FIG. 5 shows the transmission T as a function of the transmission angle Θ calculated for a 150 μm thick conversion element (99% density) with pores having an average pore diameter of 400 nm, for pore distributions of different widths, FIG. 6 shows the transmission T as a function of the transmission angle Θ calculated for a conversion element (99% density) 150 μm thick with pores with an average pore diameter of 800 nm for pore distributions of different widths, FIG. 7 shows a microscopic photo of a cutting plane of a further conversion element, FIG. 8 shows the transmission T of a perpendicularly incident light (wavelength 660 nm) as a function of the transmission angle Θ for the conversion element of FIG. 7, FIG. 9 shows the luminous efficiency L of an electroluminescent device as a function of the pore diameter PD of the ceramic material of the conversion element, and FIG. 10 shows the intensity I as a function of the viewing angle α for two conversion elements according to the invention, compared with a conversion element composed of a phosphor powder layer.

FIG. 2 schematically shows an embodiment of a light-emitting device according to the invention, with a substrate 1 and an electroluminescent light source 2 applied on the substrate 1 for emitting a primary radiation 52, as well as a conversion element 3 arranged on the electroluminescent light source 2 for the at least partial absorption of the primary radiation 52 and the emission of a secondary radiation 53. The electroluminescent light source 2 comprises an electroluminescent layer structure applied on a substrate 1 with at least one organic or inorganic electroluminescent layer, which is arranged between two electrodes. Here, the primary radiation is emitted through a transparent electrode on the side turned away from the substrate (top emitter), while the electrode turned towards the substrate 1 and/or the substrate 1 (for example of aluminum) is reflecting. Herein, the light-emitting device may also comprise several electroluminescent light sources for emitting the same and/or different primary radiation, for example a planar arrangement of LEDs and/or OLEDs. The electroluminescent light source 2 used in other embodiments may alternatively be formed by one or several laser diodes coupled to the conversion element via the light circuit elements and/or the light distribution elements.

The conversion element 3 is optically coupled to the electroluminescent light source 2 in order to avoid a transition into a medium with a refractive index smaller than 1.1 along the optical path of the electroluminescent light source 2 up to the entry of the primary radiation 52 into the conversion element 3. Such a transition would lead to an increased portion of the primary radiation being reflected back at the appropriate boundary surface due to total reflection effects, which would lead to subsequent light losses. The optical coupling may be achieved by a direct arrangement of the conversion element 3 on the electroluminescent light source 2 (see FIG. 2) or by one or several additional transparent layers (for example of silicone with a refractive index of 1.5), which are arranged between the electroluminescent light source 2 and the conversion element 3. For example, in an embodiment with an inorganic electroluminescent light source 2 with a light-emitting gallium-indium nitride layer having a refractive index of 2.2 and a Gd-YAG:Ce conversion element 3 according to the invention having a refractive index of 1.8, such a layer for the optical coupling leads to an optical transition from the electroluminescent light source to the silicone layer with a reduced refractive index difference of 0.7 as compared with a transition to air of 1.3, and a correspondingly smaller portion of primary radiation which is reflected back owing to total reflection.

Adhesion layers of flexible or hard materials with a refractive index for the primary radiation 52 of up to 3.0 may also be used for the optical coupling of the conversion element 3 to the electroluminescent light source 2, for example crosslinkable two-component silicone rubber, platinum-crosslinked, or alternatively glass materials, which are connected to the electroluminescent light source 2 and to the conversion element 3 at high temperatures.

Furthermore, it is particularly advantageous if the conversion element 3 is brought into close contact with the electroluminescent light source 2.

The conversion element 3 comprises a ceramic material with a multiplicity of pores. The scattering characteristics of the conversion element 3 are determined by the pores in the ceramic material. Given a sufficiently strong scattering effect of the conversion element 3, a Lambertian radiation pattern is obtained for the mixed light 5 which is produced by superposing of the primary and the secondary radiation. The mixed light 5 has a color that is dependent on the primary and the secondary radiation. The choice of the material of the conversion element 3 determines the spectrum of the secondary radiation 53. Variously colored mixed light 5 may be produced from suitable primary and secondary radiations, for example white mixed light 5 from blue primary radiation 52 and yellow secondary radiation 53 with a color temperature that is dependent on the ratio of primary to secondary radiation. In other applications, different combinations of primary and secondary radiation may also be realized. Instead of a partial transformation of the primary radiation, this radiation may be converted completely into secondary radiation in other embodiments, for example ultraviolet primary radiation 52 may be converted by suitable conversion materials into a different secondary radiation 53, for example blue, yellow, green, and/or red secondary radiation for producing white or differently-colored mixed light 5. Blue or differently colored primary radiation may be converted completely or partly into even longer-wave radiation. The conversion element 3 may comprise a mixture of different materials here for producing different secondary radiations, or several different conversion elements 3 may be arranged on one or more electroluminescent light sources 2 in an electroluminescent device.

For a given composition of the material, the thickness of the conversion element 3 is to be adapted to the desired ratio between the primary radiation 52 and the secondary radiation 53. A thickness above 30 μm guarantees a Lambertian radiation pattern for arbitrary wavelengths and renders a transmissivity possible for the primary radiation 52 which makes it possible to produce any desired colors of the mixed light 5 through a suitable choice of the ceramic material. Larger thicknesses are used for electroluminescent devices with which a complete transformation of the primary radiation 52 into secondary radiation 53 is desired. Conversion elements with thicknesses of up to 3000 μm can be manufactured by the manufacturing methods specified here. In other embodiments, the shape of the conversion elements 3 may deviate from the shape shown in FIG. 2. For example, the conversion element 3 may enclose the electroluminescent light source 2 like a cup. The shape of the conversion element 3 may also be implemented differently for other applications.

In a further embodiment, the electroluminescent device further comprises a lens 6 which encloses the electroluminescent light source 2 and the conversion element 3. The lens 6 serves to influence the radiation patterns of the electroluminescent device, for example for focusing, defocusing, or deflecting the mixed light 5. FIG. 2 shows by way of example an embodiment with a spherical lens 6 and with a volume 4 not filled out by the lens 6 between the conversion element 3 and the electroluminescent light source 2. The volume 4 may be filled with air or silicone rubber, for example. In other embodiments the lens 6 may alternatively be implemented such that it directly encloses the conversion element 3 and the electroluminescent light source 2 without forming a volume 4.

The conversion element 3 according to the invention comprises a ceramic material 31 with a multiplicity of pores 32 and has a density greater than or equal to 97% of the theoretical solid-state density of the ceramic material 31, while the pores 32 in the conversion element 3 essentially have a diameter between 250 nm and 2900 nm. The method of manufacturing this conversion element 3 according to the invention comprises the steps of:

(a) mixing source materials with a suitable average grain size in a suitable quantitative proportion and a suitable quantity of a fluxing agent, (b) manufacturing a microscopically homogeneous mass, which comprises the mixed source materials for further processing into a green body, (c) forming a green body with a green body density of at least 50% of the theoretical density of the ceramic material, and (d) manufacturing the conversion element (3) through sintering of the green body at temperatures between 1500° C. and 1900° C., adapted to the characteristics of the green body, in a reducing or inert atmosphere in a suitable pressure range and for a time duration adapted to the volume of the green body.

FIG. 3 shows by way of example a microscopic photo of a cutting plane of a conversion element 3 according to the invention, of an $Y_{2.685}Gd_{0.3}Ce_{0.015}Al_5O_{12}$ material (Gd-YAG:Ce) with a density of 98.73% of the theoretical solid-state density of the ceramic material 31. In the sectional picture of FIG. 3, a multiplicity of grains (or crystallites) are visible from which the ceramic material has been sintered together. The grain boundaries of the grains are visible as thin black edges. Some grains are denoted with the reference symbol 31 by way of example in FIG. 3, which numeral is also used for the ceramic material as such. A length of 50 μm is indicated at the image border as a scale yardstick. The pores 32 present between these grains are discernible as dark dots in the sectional representation of FIG. 3. Here, the ceramic material was manufactured from a mixture of 100 g $Al_2O_3$ (average grain size 0.35 μm, purity 99.99%), 120.984 g $Y_2O_3$ (average grain size 0.70 μm, purity>99.99%), 21.835 g $Gd_2O_3$ (average grain size 0.40 μm) and 1.0197 g $CeO_2$ (average grain size 0.40 μm purity>99.0%), which was ground with 850 ml isopropanol and 5.0 kg aluminum oxide grinding balls (diameter 2 mm) on a roller bench for one hour. The indicated quantity specifications account for the calcining losses of the powders as regards water and $CO_2$ and are accordingly higher than the values in the subsequent ceramic material. The calcining losses are determined by calcining at air at 1200° C. until a constant weight is obtained. The dried powder mixture is processed subsequently with a polyvinyl alcohol binder into a granulated material and dried at 110° C. The granulated material is then pressed uniaxially into a green body and then re-pressed in a cold isostatic press under a pressure of 3.2 kbar. After a baking-out step of the binder at 600° C. in air, the green body is sintered in a CO atmosphere for 2 h at 1750° C. After this sintering step a ceramic material 31 with a density of 4.66 g/cm$^3$ is obtained, which corresponds to a relative density of 98.73%. After the finishing of the ceramic material by means of grinding, polishing, and cutting, the individual converter panels are re-annealed for 4 h at 1350° C. in air. For an at least partial transformation of primary radiation with 420 nm to 480 m wavelength into longer-wave secondary radiation, the following materials may also be manufactured by the appropriate method in other embodiments as an alternative to a ceramic Gd-YAG:Ce material: $Lu_{3-x-y}Y_xAl_5O_{12}:Ce_y$ with $0 \leq x \leq 1$, $0.001 \leq y \leq 0.1$ and 515-540 nm secondary radiation, $Y_{3-x-y}Tb_xAl_5O_{12}:Ce_y$ with $0 \leq x \leq 1$, $0.001 \leq y \leq 0.1$ and 550-590 nm secondary radiation or $Lu_{3-x-y-x}Y_xAl_{5-a}Si_aO_{12-a}N_a:Ce_yPr_z$ with $0 \leq x \leq 1$, $0.001 \leq y \leq 0.1$, $0.0005 \leq z \leq 0.01$, $0.01 \leq a \leq 0.8$ and 540-630 nm secondary radiation.

Other oxidic materials such as $(Sr_{1-x-y}Ca_xBa_y)_{2-z}SiO_4:Eu_z$ with $0 \leq x \leq 0.4$, $0 \leq y \leq 0.8$, $0.001 \leq z \leq 0.01$ with 520-600 Nm secondary radiation may be manufactured by the following method:

mixing and calcining $SrCO_3$, $CaCO_3$ and optionally $BaCO_3$ with $Eu_2O_3$ and $SiO_2$ at 1100° C. in a reducing atmosphere, grinding the raw phosphor powder, hot-pressing the raw phosphor powder at 1300° C.-1400° C. at a pressure of 20-100 Mpa in a vacuum or an inert or reducing atmosphere.

Cubic materials, for example YAG, or non-cubic materials may be used as ceramic materials, for example an orthosilicate such as $(Sr_{1-x-y}Ca_xBa_y)_{2-z}SiO_4:Eu_z$. Non-cubic materials have different refractive indices for different directions in space, as their crystal structure is different for different orientations. Different crystal axes are referred to in this case. Therefore, the refractive index may change along an optical path in the conversion element owing to the spatial alignment of different regions (crystallites or grains) in the ceramic material, although it does have the same composition. In order that the light scattering is determined by the characteristics of the pores, the refractive indices should differ by less than 0.2 along the different crystal axes in the non-cubic materials.

In order to determine the size of the pores 32 comprised in the ceramic material 31, a measurement of the light scattering was carried out. Here, a disk of the conversion element 3 with a thickness of 150 μm was illuminated with a laser of 660 nm wavelength perpendicularly to the cutting plane, and the light distribution was determined for an angular range Θ of −80 degrees to 80 degrees to the normal on the layer after passing through the ceramic material (transmission T). The results of the measurement are represented as a dotted curve 7 in FIG. 4 in combination with the light distributions (continuous curves 71, 72, 73) calculated for Mie-scattering at particles with a refractive index n=1 (pores filled with air) in the ceramic material used, for three different pore diameters. Mie-scattering is understood to mean the scattering of electromagnetic waves at spherical objects. Here, the curve 71 represents the light distribution for a pore diameter of 700 nm, the curve 73 denotes a pore diameter of 900 nm, and the curve 72 a pore diameter of 800 nm. Curve 72 corresponds outstandingly to the measured light distribution, from which an average pore diameter of 800 nm results for the ceramic material.

The calculation in FIG. 4 was carried out with a uniform pore diameter of 800 nm. The good conformity to the measured values backs not only an average pore diameter of 800 nm, but also the very small variation of less than 100 nm of the pore diameters in the conversion element. The pore diameters in a ceramic material correspond to a so-termed log-normal distribution by good approximation, which indicates the relative number n(a) of the pores with a pore diameter a around an average pore diameter $a_0$:

$$n(a) = \frac{N}{as\sqrt{2\pi}} \exp\left[-\frac{\ln^2(a/a_0)}{2s^2}\right]$$

Here, s denotes the width of the distribution n(a) of the pore diameter a around the average pore diameter $a_0$. N is the total number of the pores. FIGS. 5 and 6 show the calculated transmitted intensities T as a function of the transmission angle of radiation with 660 nm wavelength through a conversion element with a density of 99% of the theoretical solid density, FIG. 5 relating to an average pore diameter of 400 nm and FIG. 6 to an average pore diameter of 800 nm. The respective four curves were calculated for different widths s of the distribution of the pore diameters n(a), s=0 nm is denoted by S41 in FIG. 5, s=300 nm by S42, s=600 nm by S43, and s=900 nm by S44. In FIG. 6, s=0 nm is denoted by S81, s=300 nm by S82, s=600 nm by S83, and s=900 nm by S84. As obvious from FIGS. 5 and 6, the intensity distribution differs clearly for curves having different pore diameter distributions but the same pore diameter. A comparison between the measured and the calculated data enables us to determine both the pore diameter and the pore diameter distribution of a conversion element, and thus to adjust them to the desired values via an adaptation of the manufacturing parameters as will be described hereinafter.

The suitable grain sizes of the source materials may be selected for adjusting the pore size, pore concentration, and the pore volume. Given the same process conditions, the pore sizes grow with the crystallite size of the source materials. As a rule, small crystallite sizes in addition lead to a narrower pore diameter distribution. Furthermore, the pore size and the pore concentration may be affected by the following parameters, a) sintering temperature: a higher sintering temperature results in higher densities of the ceramic material and smaller pores, b) sintering time: a longer sintering time results in higher densities and smaller pores, c) fluxing agent: adding a fluxing agent such as, for example, $SiO_2$ to the source materials results in higher densities and larger pores under the same sintering conditions, because the grain growth increases, d) pressure range of the atmosphere during the sintering step: the pressure of the gas in the pore volume represents a counter force to the shrinking process of the material during sintering. High pressures lead to less shrinkage and thus tends towards larger pores, low pressures cause the opposite. Typical pressures are in the range between $10^{-9}$ and $10^2$ bar.

Additionally, the pore diameter may also be affected by a temperature treatment for removing oxygen defects in an oxygen-containing atmosphere at temperatures between 1250° C. and 1400° C., which treatment is carried out after sintering in a reducing atmosphere.

FIG. 7 shows by way of example a microscopic photo of a cutting plane of a conversion element 3 of a $Y_{2.685}Gd_{0.3}Ce_{0.015}Al_5O_{12}$ material (Gd-YAG:Ce) with a density of 99.5% of the theoretical solid-state density of the ceramic material 31, wherein the average pore diameter of this conversion element at 4000 nm lies above the range according to the invention of 250 nm to 2900 nm. The ceramic material 31 was manufactured from a mixture of source materials with a larger $Y_2O_3$ and $Gd_2O_3$ grain size, which leads to larger pore diameters with a reduced theoretical solid density in comparison with the previous embodiment (see FIG. 3). The source materials for the ceramic material shown in FIG. 7 were 100 g $Al_2O_3$ (average grain size 0.35 μm, purity 99.99%), 120.984 g $Y_2O_3$ (average grain size 1.10 μm, purity>99.99%), 21.835 g $Gd_2O_3$ (average grain size 2.56 μm), and 1.0197 g $CeO_2$ (average grain size 0.40 μm, purity>99.0%). In FIG. 8 the measured transmission T (squares) of a perpendicularly incident light (wavelength 660 nm) is represented as a function of the transmission angle Θ for the conversion element (thickness 100 μm) of FIG. 7 in comparison with the intensity of the transmitted radiation (transmission T, broken line) calculated by means of Mie-scattering, for the purpose of determining the pore diameters and the width of the pore diameter distribution. For an underlying log-normal distribution with an average pore diameter $a_0$ of 4000 nm and a width s of the distribution of 900 nm, an outstanding conformity between the measured values and the calculated values is obtained for the intensity. The pore diameter lies clearly above the pore diameter of 800 nm of the conversion element according to the invention of FIGS. 3 and 4, although the density of the conversion element of FIG. 7 with 99.5% is greater than the density of the conversion element according to the invention with 98.73%. The same applies to the width of the pore diameter distribution. This comparison shows clearly that the average pore diameter and the pore diameter distribution cannot be inferred from the density of a ceramic material.

FIG. 9 shows the luminous efficiency as a function of the pore diameter for conversion elements 3 with a density of the ceramic material of 99% of the theoretical solid-state density and a thickness of 80 μm in the direction of the beam of the primary radiation. An appropriate conversion element 3 according to the invention, with pores 32 having a pore diameter of 800 nm, represents an embodiment with which the luminous efficiency is a maximum with 88%. With corresponding conversion elements 3 according to the invention having pores 32 with diameters between 250 nm and 2900 nm in a range 8a, luminous efficiencies of 80% and more are obtained. Pore diameters between 300 nm and 1700 nm in a range 8b actually lead to luminous efficiencies of 85% and more. Here, the ratio between the number of emitted photons of an electroluminescent device with the conversion element and the number of emitted photons of an electroluminescent device without conversion element is to be understood as luminous efficiency. By contrast, the luminous efficiency clearly decreases for pore diameters smaller than 250 nm. For pore diameters above 2900 nm the drop in the luminous efficiency for large pore diameters is not as steep as with small pore diameters. The conversion element not according to the invention, according to the FIGS. 7 and 8, provides a luminous efficiency of only 75% for the same density of the ceramic material. Here, the large width of 900 nm of the pore diameter distribution has an additional unfavorable effect as compared with a conversion element according to the invention with a narrow distribution width, because the pore diameter distribution is asymmetrical, and a large distribution width means that a large proportion of the distribution is accounted for by large pore diameters.

FIG. 10 shows the intensity distribution of a white mixed light 5 as a function of the viewing angle α for two electroluminescent devices according to the invention, with conversion elements 3 according to the invention, of a $Y_{2.685}Gd_{0.3}Ce_{0.015}Al_5O_{12}$ material emitting in the yellow spectral region and having a density of 98.73% of the theoretical solid density, which has a thickness of 55 μm (curve 92) and 83 μm (curve 91) in the direction of the beam of the primary radiation 52, as well as the corresponding intensity distribution of an electroluminescent reference device (curve 10) with a phosphor powder layer as a conversion element. Here, the angle between the viewing direction and the layer normal on the conversion element is regarded as the viewing angle. In order to examine the quality of a desired Lambertian radiation pattern, particularly strongly scattering layers with an essentially ideal Lambertian radiation pattern such as, for example, phosphor powder layers are suitable, even if these layers have a luminous efficiency substantially smaller than the conversion elements according to the invention. The conversion elements 3 according to the invention were cut to a size of 1300 μm×1160 μm and mounted by means of silicone onto an LED 2 that emits a blue primary radiation, has a surface of 1 $mm^2$, and is covered with a lens 6 as shown in FIG. 2. The volume 4 (see FIG. 2) was filled up with silicone. As is apparent from FIG. 10, both curves 91 and 92 correspond very well to the reference curve 10 and thus to a Lambertian radiation pattern.

The embodiments explained by means of the Figs. and the description only represent examples of a conversion element according to the invention and should not be construed as a limitation of the patent claims to these examples. Alternative embodiments are also possible to those skilled in the art, which embodiments are likewise covered by the scope of protection of the patent claims. The numbering of the dependent claims should not imply that other combinations of the claims do not represent favorable embodiments of the invention.

The invention claimed is:

1. A conversion element comprising:
   a ceramic material with a multiplicity of pores provided for at least the partial absorption of at least one primary radiation and for transforming said primary radiation into at least one secondary radiation,
   wherein the conversion element has a density greater than 97% of the theoretical solid-state density of the ceramic material and the pores in the conversion element have a diameter substantially between 200 nm and 5000 nm.

2. A conversion element as claimed in claim 1, characterized in that the ceramic material is provided for at least the partial transformation of blue or ultraviolet primary radiation.

3. A conversion element as claimed in claim 1, characterized in that the pores have a proportional volume of less than or equal to 2% of the conversion element.

4. A conversion element as claimed in claim 1, characterized in that the pores have a pore diameter distribution that can be essentially described by means of a log-normal distribution whose width is less than 100 nm.

5. A conversion element as claimed in claim 1, characterized in that the diameter of the pores is essentially between 300 nm and 1700 nm.

6. An electroluminescent device comprising an electroluminescent light source for emitting at least one primary radiation in a first direction and at least one conversion element as claimed in claim 1 that is optically coupled to the electroluminescent light source for producing a mixed light from the primary radiation and the secondary radiation.

7. An electroluminescent device as claimed in claim 6, characterized in that the conversion element is optically coupled to the electroluminescent light source by means of a transparent layer with a refractive index higher than 1.3.

8. An electroluminescent device as claimed in claim 6, characterized in that the conversion element has a thickness between 30 μm and 3000 μm in the first direction of the primary radiation.

9. An electroluminescent device as claimed in claim 6, further comprising a lens which encloses the electroluminescent light source and the conversion element.

10. A conversion element as claimed in claim 1, characterized in that the diameter of the pores is essentially between 500 nm and 2900 nm.

11. A conversion element as claimed in claim 1, characterized in that the diameter of the pores is essentially between 550 nm and 5000 nm.

12. A conversion element as claimed in claim 1, characterized in that the diameter of the pores is essentially between 550 nm and 2900 nm.

13. A conversion element as claimed in claim 1, characterized in that the diameter of the pores is essentially between 550 nm and 1700 nm.

14. A conversion element comprising:
a ceramic material with a multiplicity of pores provided for at least the partial absorption of at least one primary radiation and for transforming said primary radiation into at least one secondary radiation,
wherein the conversion element has a density greater than 97% of the theoretical solid-state density of the ceramic material and the pores in the conversion element have a diameter substantially between 200 nm and 5000 nm and the pores have a pore diameter distribution that can be essentially described by means of a log-normal distribution whose width is less than 100 nm.

15. An electroluminescent device comprising:
an electroluminescent light source for emitting at least one primary radiation in a first direction; and
at least one conversion element comprising:
a ceramic material with a multiplicity of pores provided for at least the partial absorption of at least one primary radiation and for transforming said primary radiation into at least one secondary radiation,
wherein the conversion element has a density greater than 97% of the theoretical solid-state density of the ceramic material and has a thickness between 30 μm and 3000 μm in the first direction of the primary radiation,
wherein the pores in the conversion element have a diameter substantially between 200 nm and 5000 nm.

16. The electroluminescent device of claim 15, wherein the pores in the conversion element have a diameter substantially between 300 nm and 2700 nm.

17. The electroluminescent device of claim 16, wherein the pores have a pore diameter distribution that can be essentially described by means of a log-normal distribution whose width is less than 100 nm.

* * * * *